United States Patent
Naeem et al.

(10) Patent No.: US 6,893,938 B2
(45) Date of Patent: May 17, 2005

(54) STI FORMATION FOR VERTICAL AND PLANAR TRANSISTORS

(75) Inventors: Munir D. Naeem, Poughkeepsie, NY (US); Hiroyuki Akatsu, Yorktown Heights, NY (US); Byeong Kim, Lagrangeville, NY (US); Rolf Weis, Dresden (DE); David Mark Dobuzinksy, New Windsor, NY (US); Johnathan E. Faltermeier, Lagrangeville, NY (US)

(73) Assignees: Infineon Technologies AG, Munich (DE); International Business Machines Corporation, Armonk, NY (US)

( * ) Notice: Subject to any disclaimer, the term of this patent is extended or adjusted under 35 U.S.C. 154(b) by 105 days.

(21) Appl. No.: 10/419,588

(22) Filed: Apr. 21, 2003

(65) Prior Publication Data

US 2004/0209486 A1 Oct. 21, 2004

(51) Int. Cl.[7] .............................................. H01L 21/76
(52) U.S. Cl. ...................... 438/424; 438/717; 438/735; 438/736
(58) Field of Search ................................ 438/424, 717, 438/735, 736

(56) References Cited

U.S. PATENT DOCUMENTS

| | | | | |
|---|---|---|---|---|
| 6,001,706 A | * | 12/1999 | Tan et al. | 438/424 |
| 6,030,541 A | * | 2/2000 | Adkisson et al. | 216/51 |
| 6,069,091 A | * | 5/2000 | Chang et al. | 438/719 |
| 6,287,951 B1 | * | 9/2001 | Lucas et al. | 438/618 |
| 6,342,832 B1 | * | 1/2002 | Fuchs et al. | 340/436 |
| 6,524,964 B2 | * | 2/2003 | Yu | 438/736 |
| 6,545,306 B2 | * | 4/2003 | Kim et al. | 257/296 |
| 6,589,879 B2 | * | 7/2003 | Williams et al. | 438/714 |
| 6,724,031 B1 | * | 4/2004 | Akatsu et al. | 257/302 |
| 6,743,727 B2 | * | 6/2004 | Mathad et al. | 438/695 |
| 2002/0134754 A1 | * | 9/2002 | Kim | 216/39 |
| 2004/0175950 A1 | * | 9/2004 | Puppo et al. | 438/691 |

OTHER PUBLICATIONS

Wolf, S., et al. "Silicon Processing for the VLSI Era" vol. 1: Process Technology, Second Edition, Lattice Press, Sunset Beach, CA. pp. 488–489, 2000.

Akatsu, H., et al. "A Highly Manufacturable 110nm DRAM Technology with $8F^2$ Vertical Transistor Cell for 1Gb and Beyond," 2002 Symposium on VLSI Technology Digest of Technical Papers pp. 52–53, Jun. 2002.

McStay, K., et al. "Vertical Pass Transistor Design for Sub–100nm DRAM Technologies," 2002 Symposium on VLSI Technology Digest of Technical Papers, pp. 180–181, Jun. 2002.

* cited by examiner

*Primary Examiner*—Christian Wilson
(74) *Attorney, Agent, or Firm*—Slater & Matsil, L.L.P.

(57) ABSTRACT

A method for forming shallow trench isolation (STI) for semiconductor devices. A first hard mask is deposited over a semiconductor wafer, and a second hard mask is deposited over the first hard mask. The semiconductor wafer includes a first etching zone and at least a second etching zone disposed beneath the first etching zone. The etch process for the first etching zone and the etch process for the at least one second etching zone are selected such that smooth sidewall surface structures are formed within the semiconductor device. The etch processes for each subsequent etching zone may alternate between non-selective and selective etch processes to preserve at least the first hard mask material.

48 Claims, 13 Drawing Sheets

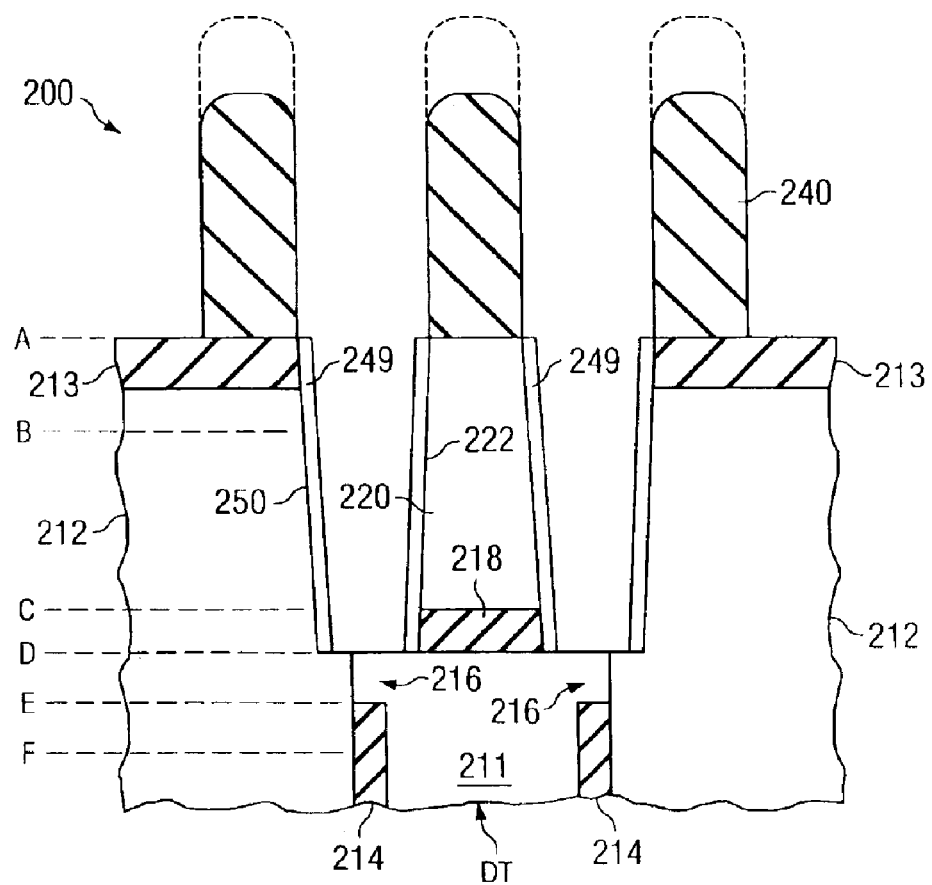

STI FORMATION FOR VERTICAL AND PLANAR TRANSISTORS

TECHNICAL FIELD

The present invention relates generally to the fabrication of semiconductor integrated circuit (IC) structures, and more particularly to the formation of shallow trench isolation (STI) structures in IC devices.

BACKGROUND

Microcircuit fabrication in semiconductor devices involves the introduction of impurities into extremely small regions of a substrate, which are subsequently interconnected to create components and very large scale integrated (VLSI) circuits. The patterns that define the small regions are created by lithographic processes.

A lithographic process involves spin-coating a layer of photoresist material onto the wafer substrate. The photoresist is selective exposed to a form of radiation, such as ultraviolet light, electrons or x-rays. An exposure tool and mask are used to affect the desired selective exposure. The patterns in the photoresist are formed when the wafer undergoes a subsequent "development" step. The areas of resist remaining after development protect the substrate regions that they cover during a subsequent etch process for the underlying material. A resist may be positive or negative, meaning that the image is either positive or negative with respect to the mask image.

Locations from which resist has been removed are subjected to an etching process to transfer the pattern onto the substrate surface. A plurality of material layers, which may comprise insulating, conductive, and semiconductive material layers, are deposited over the substrate and patterned and etched in this fashion. Some advanced integrated circuits have twenty or more masking layers, for example.

A common technique used to provide electrical isolation between various element regions of a semiconductor wafer is often referred to as shallow trench isolation (STI), or the formation of isolation trenches (IT). This technique is used frequently in the fabrication of memory cells, for example. Typically, a plurality of steps and material layers are deposited and patterned on a wafer substrate, and then the isolation regions are formed within the patterned material layers.

FIG. 1 illustrates a prior art STI technique used to isolate active areas of a semiconductor device such as a memory array. A semiconductor wafer 10 having a crystalline silicon 12 substrate is covered with a layer of pad nitride 13. A thin layer of pad oxide may reside between the silicon substrate 12 and the pad nitride 13, for example (not shown). In this method of providing shallow trench isolation, a photoresist 26 is deposited over the pad nitride 13, and the photoresist 26 is patterned with the desired pattern of the isolation trenches (IT), shown in phantom. The photoresist 26 is then used to mask the semiconductor wafer 10 while an etch process is used to etch away exposed portions of the pad nitride 13 and underlying substrate 12, for example. The isolation trenches IT formed in the silicon 12 and pad nitride 13 are later filled with an insulator such as an oxide, and the wafer 10 is then polished by a chemical-mechanical polish (CMP) process or other removal process, such as a reactive ion etch (RIE), as an example, down to at least the pad nitride layer 13 surface, leaving the oxide in the trenches IT to provide isolation between devices (not shown).

One problem with the STI technique of FIG. 1 is that as these materials are etched, a portion of photoresist 26 is removed. Because the photoresist 26 is removed as the isolation trenches IT are formed, it may be necessary to deposit a relatively large amount of photoresist 26 over the semiconductor wafer surface, when a relatively deep IT is to be formed, such as is necessitated by a vertical cell design, for example. This can be problematic, because the patterned photoresist 26 may have a high aspect ratio, e.g., the height h may be much greater than the width w. The high aspect ratio of the photoresist may also be driven by the shrinking of design ground rules of the device, as is the trend in the semiconductor industry, to achieve improved performance and higher speed. Because the patterned photoresist 26 is very tall and thin, the patterned photoresist 26 may collapse in certain regions, as shown in phantom in FIG. 1 at 28, resulting in a poor image transfer. Furthermore, a thin resist is needed for small ground rules for acceptable image definition.

Because resist 26 thinning is needed for good image definition and collapse prevention, a hard mask 34 is frequently used between the pad nitride 13 and the photoresist 26, as shown in the prior art drawing of FIG. 2. The hard mask 34 typically comprises either boron-doped silicon glass (BSG), polysilicon, or tetraethoxysilane (TEOS), as examples. An anti-reflective coating (ARC), (not shown), comprising, for example, an organic polymer or a dielectric material, may be deposited over the hard mask 34, and a photoresist 26 typically comprising an organic polymer is deposited over the ARC. ARC is used to reduce reflection during exposure because reflection can deteriorate the quality of the image being patterned.

The photoresist 26 is patterned using lithography techniques and etched to remove exposed portions, and, after an ARC open step, the semiconductor wafer 10 is exposed to an etch process, e.g. an anisotropic etch in a plasma reactor, to transfer the resist 26 pattern to the hard mask 34, as shown in FIG. 2. Reactive ion etching (RIE) is often used to transfer the pattern from the photoresist 26 to the hard mask 34, for example. Portions of the wafer 10 not covered by the hard mask 34 and photoresist 26 are then etched to form isolation trenches IT within the wafer 10 using the photoresist 26 and hard mask 34 to pattern the isolation trenches IT, as shown in phantom in FIG. 2. An insulating material (not shown) is then deposited over the wafer 10, as described for FIG. 1, to provide isolation between the various regions of the wafer 10.

A problem with the process shown and described with reference to prior art FIG. 2 is that while the hard mask (HM) 34 is less susceptible to removal during the formation of the isolation trenches IT, the hard mask 34 thickness needs to be increased for IT depth in a vertical/planar cell. A vertical/planar cell comprises vertical regions 15 comprising vertical devices and planar regions 17 comprising planar or horizontal devices, as shown in FIG. 3. Transistors in the planar regions 17 have a source and drain disposed horizontally across the wafer 10 surface, while vertical regions 15 have transistors with a vertical source and drain, for example.

Referring again to FIG. 2, the patterning of the entire thickness of the hard mask 34 often cannot be completed successfully with the thin resist 26 dictated by collapse and image constraints. One anticipated solution to this problem is to increase photoresist/hard mask 26/34 selectivity by use of high carbon to fluorine (C/F) ratio gases. However, this solution leads to bread-loafing 36, which tends to occur at the top surface of the photoresist 26, as shown in FIG. 2 at 36. This occurs because during the etch process, which typically comprises an RIE process, additional polymer material is deposited on top of the photoresist 26. The bread-loafing 36 forms as a result of the RIE process. The bread-loafing 36 makes the photoresist 26 thicker at top corners, and creates a re-entrant profile or over-etched regions 30 in the regions being etched, resulting in a structure such as the one shown. The bread-loafing 36 leads to poor critical dimension (CD) control, and is undesirable.

Patterning an underlying semiconductor wafer 10 having a variety of different layers of differing materials, such as oxides, nitrides, and various forms of semiconductor material layers proves very challenging, because each of these materials etches at different rates and is more susceptible to etching with various chemistries. As ground rules shrink, patterning semiconductor wafers 10 having complex and varying material layers becomes more and more difficult.

What is needed in the art is an improved method of providing shallow trench isolation that does not have the re-entrant profiles (which are not conducive to void-free filling of insulating materials) that result from prior art processes, and provides smooth slightly sloping sidewalls, in particular for smaller-scale ground rules.

SUMMARY OF THE INVENTION

These and other problems are generally solved or circumvented, and technical advantages are generally achieved, by preferred embodiments of the present invention which comprise a method of providing a scheme of two or more hard mask films arranged in a stack, that provides improved etch selectivity for isolation trench formation. The method involves selecting etch parameters for various etching zones that are encountered as the etch process proceeds downward from the top surface of a wafer, such that smooth sidewalls are formed within the device, regardless of the various material layers. Etching zones containing two or more different materials are etched at substantially the same rate. A dual hard mask may be implemented, and alternating etch zones may be etched non-selectively and selectively.

In accordance with a preferred embodiment of the present invention, a method of patterning a semiconductor device includes providing a substrate, the substrate comprising a plurality of device regions, depositing a first hard mask over the substrate, the first hard mask comprising a first material, and depositing a second hard mask over the first hard mask, the second hard mask comprising a second material, the second material being different from the first material. A photoresist is deposited over the second hard mask, the photoresist is patterned, and the pattern of the photoresist is transferred to the second hard mask. The pattern of the photoresist is transferred to the first hard mask, and the substrate is patterned with at least the second hard mask and first hard mask to form isolation regions between the device regions of the substrate.

In accordance with another preferred embodiment of the present invention, a method of patterning isolation trenches of a memory device includes providing a semiconductor wafer having a top surface and including a substrate having a plurality of memory cells formed therein, the semiconductor wafer including a first etching zone and a second etching zone disposed beneath the first etching zone. A first hard mask is deposited over the substrate, the first hard mask comprising an oxide. A second hard mask is depositing over the first hard mask, the second hard mask comprising a semiconductor material. A photoresist is deposited over the second hard mask, and the photoresist is patterned with an isolation trench pattern. The isolation trench pattern is transferred to the second hard mask and the first hard mask, and the semiconductor wafer is patterned with the second hard mask and the first hard mask to form isolation trenches in the substrate between the memory cells, wherein the etch process for the second etching zone is different from the etch process for at least the first etching zone.

An advantage of preferred embodiments of the present invention is providing a means for patterning a semiconductor wafer that produces smooth sidewalls, in spite of the variety of materials being etched in a particular zone. The etch process generates the smooth sidewalls without material dependent biases. The use of a thinner layer of photoresist may be accomplished, by using a dual hard mask. Because re-etchant profiles are not generated using the novel patterning method, void-free insulating films can be formed within the isolation trenches patterned. Embodiments of the present invention are particularly advantageous when used in vertical/planar cell or semiconductor device applications.

The foregoing has outlined rather broadly the features and technical advantages of embodiments of the present invention in order that the detailed description of the invention that follows may be better understood. Additional features and advantages of embodiments of the invention will be described hereinafter which form the subject of the claims of the invention. It should be appreciated by those skilled in the art that the conception and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which:

FIG. 9d shows a cross-sectional view of the wafer after the third etching zone C-D has been non-selectively etched, wherein an additional top portion of the second hard mask is removed during the etch process;

Corresponding numerals (e.g., 1xx, 2xx, 3xx) and symbols in the different figures generally refer to corresponding parts unless otherwise indicated. The figures are drawn to clearly illustrate the relevant aspects of the preferred embodiments and are not necessarily drawn to scale.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely a vertical DRAM device. However, the concepts described herein may easily be extended logic and/or embedded logic and DRAM devices. Embodiments of the invention may also be applied, however, to other semiconductor devices requiring isolation regions, such as other memory devices, and in particular, has application in memory devices having planar access transistors, as an example.

A DRAM typically includes millions or billions of individual DRAM cells, with each cell storing one bit of data. A DRAM memory cell typically includes an access field effect transistor (FET) and a storage capacitor. The access FET allows the transfer of data charges to and from the storage capacitor during reading and writing operations. In a vertical DRAM, the access FET is positioned vertically, whereas in other DRAM designs, the access FET is positioned horizontally, e.g., parallel to the wafer surface. The data charges on the storage capacitor of a DRAM are periodically refreshed in a refresh operation.

Memory devices are typically arranged in an array of memory cells. A source/drain region of the cell access FET is coupled to a bitline, and the other source/drain region is coupled to a plate of a respective storage capacitor. The other plate of the capacitor is coupled to a common plate reference voltage. The gate of the transistor is coupled to a wordline. The storing and accessing of information into and from memory cells is achieved by selecting and applying voltages to the wordlines and bitlines. In fabricating semiconductor devices such as DRAM's, shallow trench isolation (STI) is a technique used to provide electrical isolation between various element regions, such as the memory cells and/or access FETs.

Figure 4:
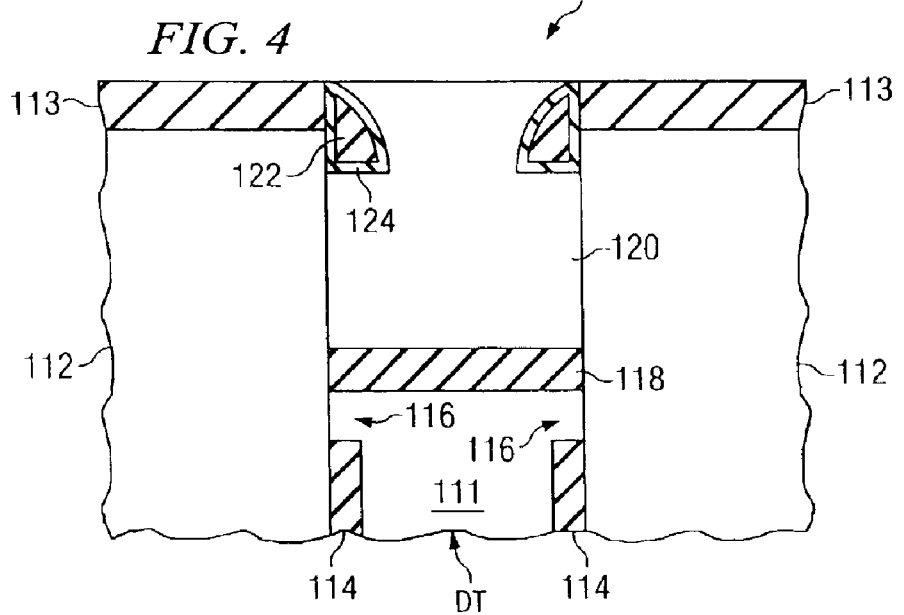
FIG. 4 shows a cross-sectional view of a vertical DRAM device.

FIG. 4 illustrates a vertical DRAM device that is desired to be patterned with isolation trenches. The vertical DRAM device includes a semiconductor wafer 100 having a crystalline silicon substrate 112 covered with a layer of pad nitride 113 (e.g., 200–300 nm of silicon nitride). A pad oxide may reside between the substrate 112 and the pad nitride 113, for example (not shown). The substrate 112 and pad nitride 113 are patterned with trenches, such as the deep trenches DT shown. For example, one deep trench DT is shown in FIG. 4, which may comprise the storage cell or capacitor of a DRAM.

An insulating collar 114 is formed within a bottom portion of each trench DT. The insulating collar 114 may comprise a thin oxide liner, for example. The trenches DT are filled with a first doped polycrystalline silicon (polysilicon) 111, which is etched back to a predetermined depth below the silicon 112 surface. A trench top oxide 118 is formed over the polysilicon 111 in the trench, and a buried strap region 116 resides below the trench top oxide 118 within the first doped polysilicon 111. Second doped polysilicon 120, e.g., that may be n+ doped or alternatively may comprise other doping levels and/or types, is deposited over the trench top oxide 118. Trench spacers 122, which may comprise silicon nitride and may be encapsulated in a thermal oxide 124, for example, reside near the top of the doped polysilicon 120 proximate the pad nitride 113, between the substrate 112 and the doped polysilicon 120. The deep trench DT contains the storage capacitor of the memory cell, and the vertical access transistor comprises the buried strap 116 which functions as the drain, a source, which is disposed above the TTO (not shown in FIG. 3), and a vertical gate, which is located along the substrate 112 proximate the drain.

Figure 2:
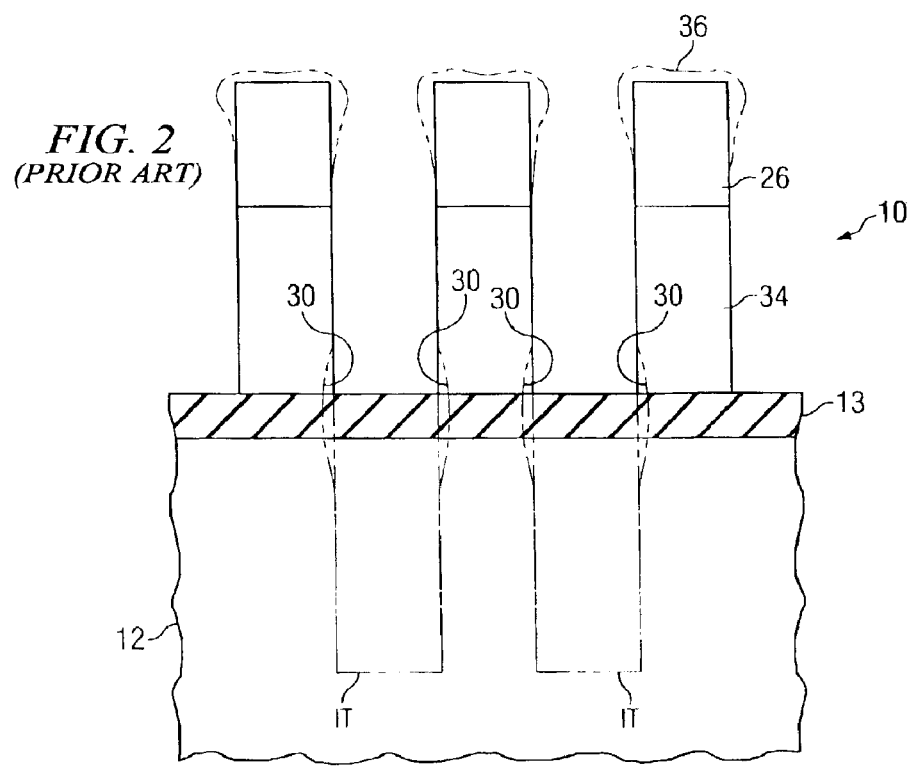
FIG. 2 shows a cross-sectional view of a prior art isolation trench etch process having a hard mask that exhibits photoresist bread-loafing and a re-entrant profile of the patterned materials.
Figure 5:
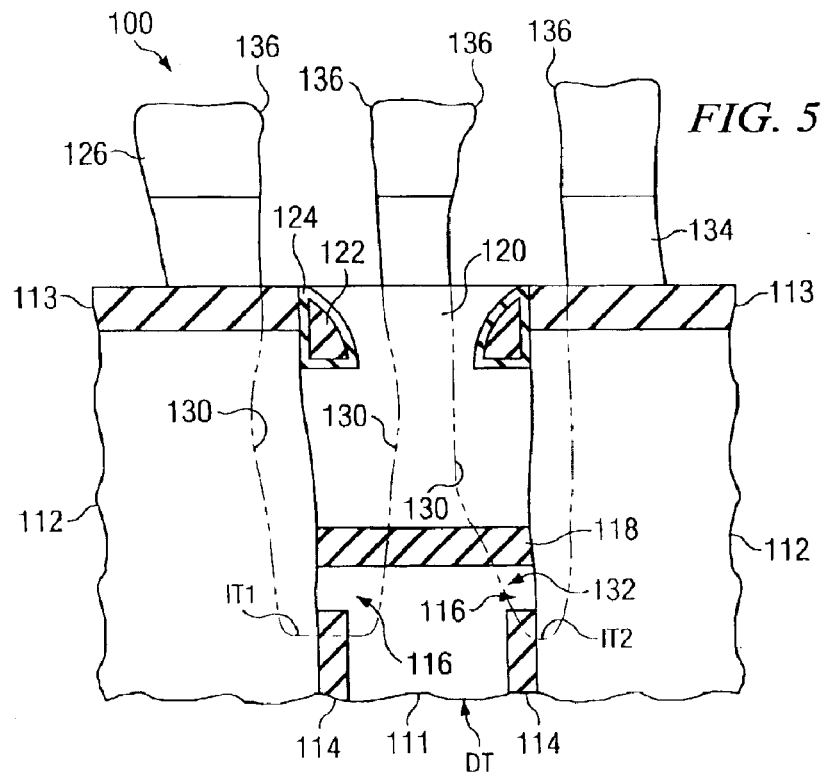
FIGS. 5–7 illustrate problems of using a prior art STI formation process to form isolation trenches in a vertical DRAM device such as the one shown in FIG. 4, wherein the re-entrant profile of the patterned materials results in void formation of the deposited insulating material.
Figure 6:
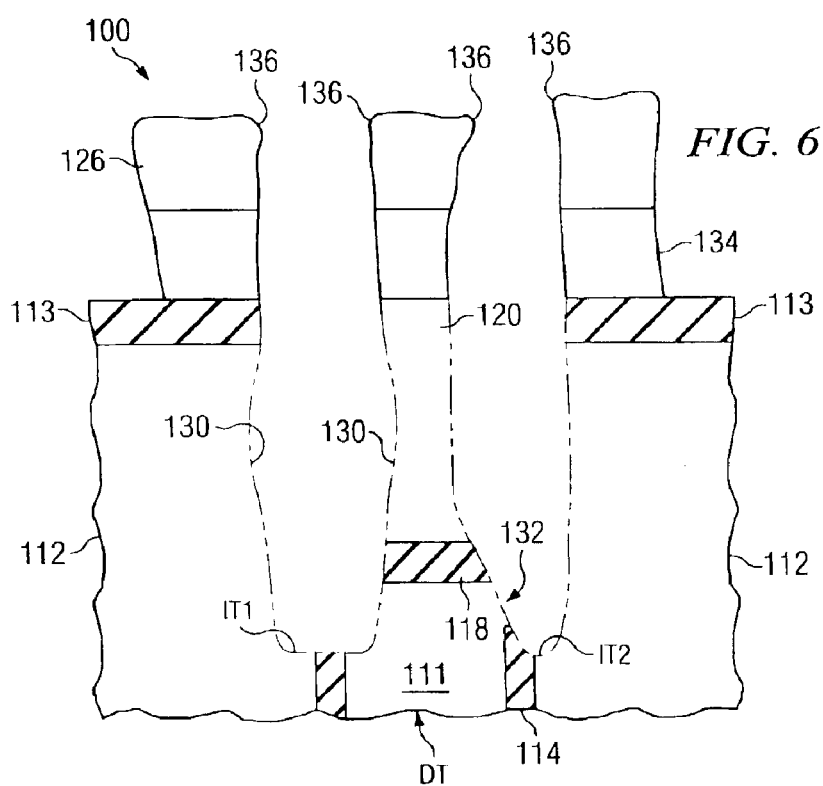
Figure 7:
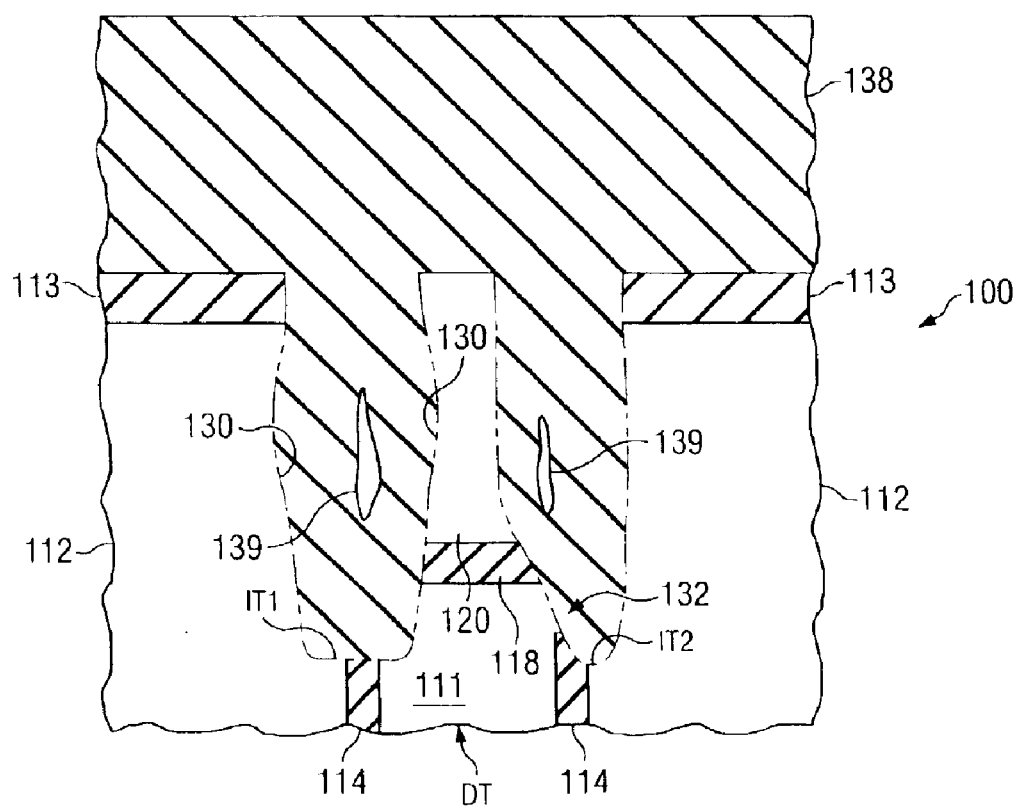

FIGS. 5 through 7 illustrate a prior art STI technique, such as the one shown in FIG. 2, attempting to be used to isolate active areas of a DRAM array having vertical access FETs, such as the vertical DRAM device shown in FIG. 4. A hard mask 134 comprising BSG, thermal oxide, BPSG, or TEOS, as examples, is first deposited over the pad nitride 113 and exposed portions of the doped polysilicon 120. A resist 136 is then deposited over the hard mask 134. The resist 136 is then patterned and etched, and is used to pattern the hard mask 134. The hard mask 134 and resist 136 would then be used to pattern the underlying materials, such as exposed portions of the pad nitride 113, and portions of the doped polysilicon 120, oxide encapsulation 124, spacer 122, the substrate 112, trench top oxide 118, buried strap 116 (polysilicon 111) and collar oxide 114, for example.

One problem with this STI technique is that there are many different types of materials being etched during the formation of the isolation trenches IT for a vertical DRAM device, including oxides 124, 118, 114, nitrides 113, 122, and various semiconductor materials 112, 111, 120 having different doping concentrations, which results in the these materials being etched at different rates. The various semiconductor materials 112, 111 and 120 are etched at different rates because of their doping concentrations and morphology. Different chemistries may also be required to etch the various materials. As these materials are etched, portions of the photoresist 126 and the hard mask 134 are removed.

Another problem with the process shown with reference to FIG. 4 is that while the hard mask 134 is less susceptible to removal during the formation of the isolation trenches IT1 and IT2 than the resist 126 is, and provides increased photoresist/oxide selectivity, bread-loafing 136 tends to occur at the top surface of the photoresist 126, as described with reference to FIG. 2. This occurs because during the etch process comprising a RIE, additional polymer material is deposited on top of the photoresist 126 for a process requiring photoresist/oxide (hard mask) selectivity, for example.

Figure 1:
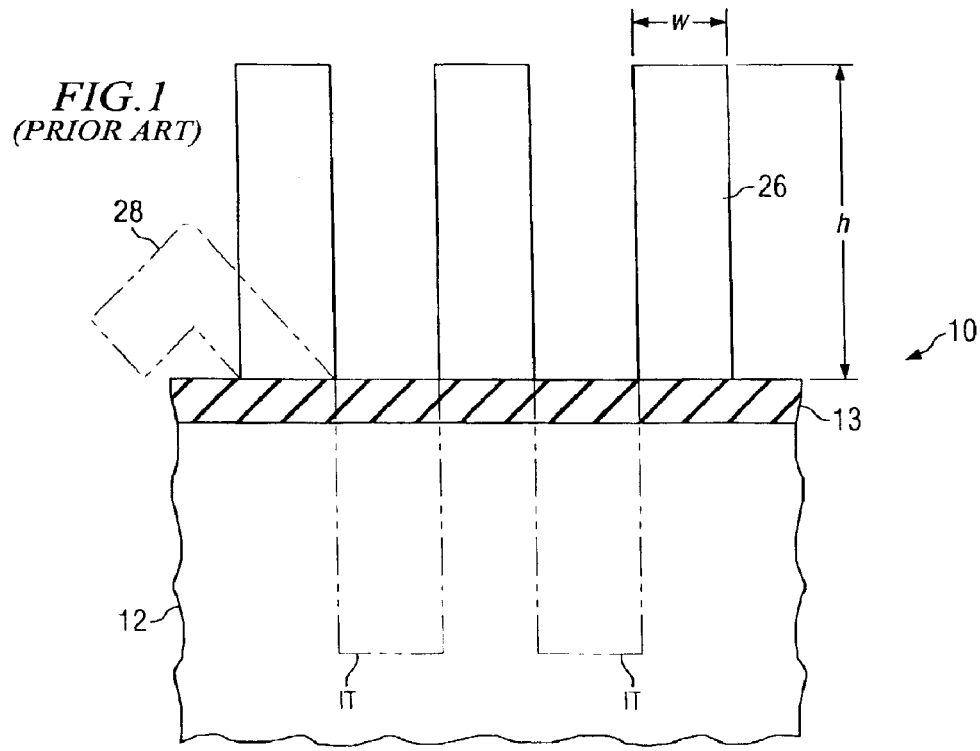
FIG. 1 shows a cross-sectional view of a prior art isolation trench etch process having a thick photoresist.

The bread-loafing 136 makes the photoresist 126 thicker at top regions, and creates a re-entrant profile or over-etched regions 130, where less of the etchant medium enters the trench, resulting in a structure such as the one shown, as shown in FIG. 6. Other regions, e.g. at 132 in IT2, may be under-etched in a sloped manner, for example. The bread-loafing 136 leads to poor critical dimension (CD) control, and is undesirable. Furthermore, a relatively thick amount of photoresist 126 is required to pattern the hard mask 134 and underlying layers in the wafer 100, which may result in the photoresist 126 collapsing, as shown in FIG. 1 at 28. The use of a thick photoresist 126 also results in poor image resolution, in smaller-scale ground rules.

When these isolation trenches IT1 and IT2 are filled with insulating material 138, as shown in FIG. 7, voids 139 may form in the insulating material 138 due to the reentrant profiles 130, as shown. Void formation 139 is undesirable because subsequently deposited conductive materials, such as for wordlines and gate structures, would not be properly etched, and if excess conductive material is deposited in the voids 139, this may cause shorts.

Figure 8:
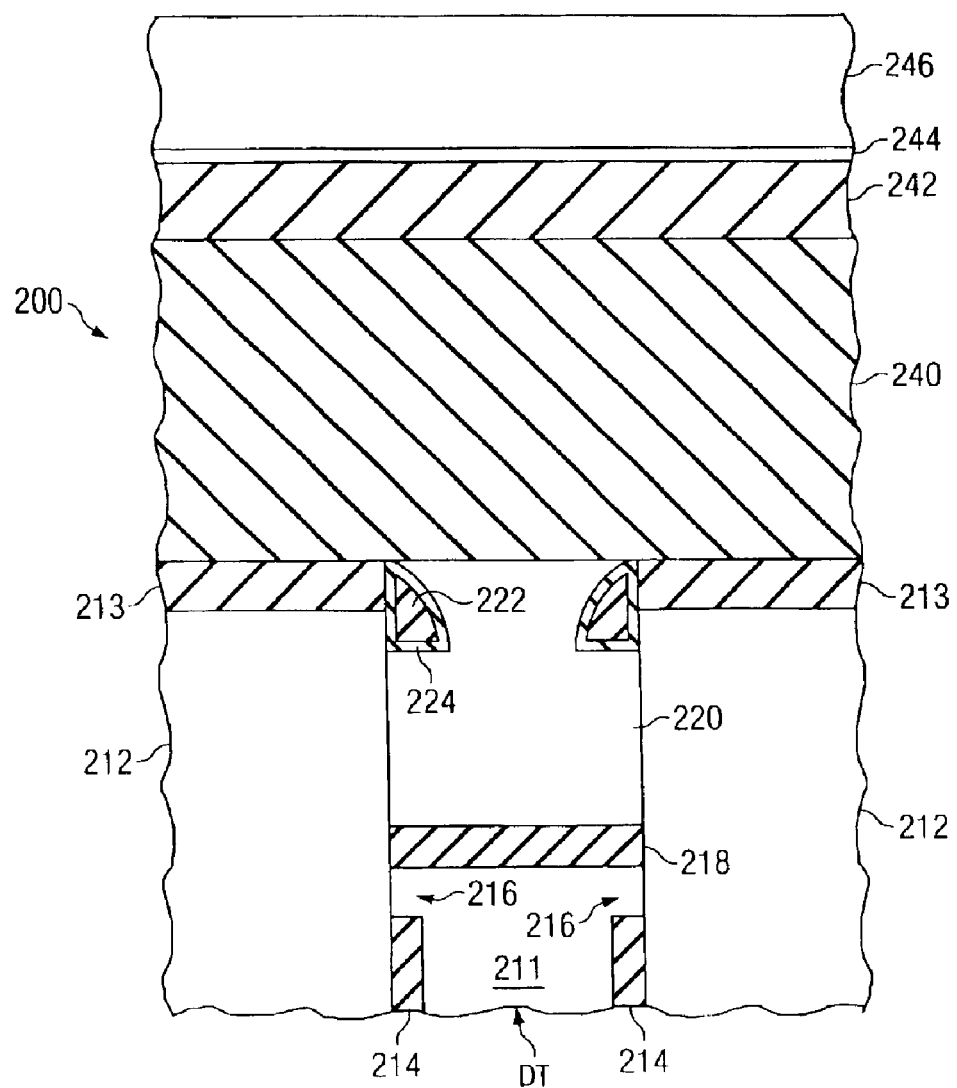
FIG. 8 shows an embodiment of the present invention, wherein a first hard mask, a second hard mask and a photoresist are deposited over a semiconductor wafer to be patterned.

With reference now to FIG. 8, therein is shown a method of patterning a semiconductor wafer 200 in accordance with an embodiment of the present invention. The method comprises providing a substrate 212, the substrate 212 including a pad nitride 213 and comprising device regions such as a memory cell formed within a deep trench DT. In the example shown in FIG. 8, the memory cell comprises a vertical DRAM cell, although alternatively, the device regions may comprise other active regions and circuits within the substrate 212. Although only one memory cell and deep trench DT is shown in each of the figures, a plurality of memory cells, device regions and/or DT's may be formed within the substrate 212. The semiconductor wafer 200 may comprise vertical DRAM devices, having the same materials and structures formed therein as described with reference to FIG. 4, as an example. The pad nitride 213 may comprise two layers of nitride material, for example.

A first hard mask 240 is deposited over the substrate, the first hard mask 240 comprising a first material. The first hard mask 240 preferably comprises an oxide material, such as boron-doped silicon glass (BSG), borophosphosilicate glass (BPSG) or tetraethoxysilate (TEOS), and alternatively may comprise other insulating materials, as examples. The first hard mask 240 may comprise 2,200 nm or less, and preferably comprises a thickness of 50 to 600 nm, for example.

A second hard mask 242 is deposited over the first hard mask 240, the second hard mask 242 comprising a second material, the second material being different from the first material. The second hard mask 242 preferably comprises a semiconductor material, and more preferably comprises polysilicon, although other semiconductor materials may alternatively be used for the second hard mask 242. The second hard mask 242 may alternatively comprise a metallic material, such as tungsten as an example, or a refractory metal, such as TiN or silicon carbide, as examples. The second hard mask 242 may comprise 400 nm or less, and more preferably comprises a thickness of 50 to 200 nm, for example.

An ARC 244 may be deposited over the second hard mask 242, and a photoresist 246 is deposited over the second hard mask 242 or ARC 244. The photoresist 246 preferably comprises a spin-on polymer typically used in photolithography. The photoresist 246 is advantageously deposited thinner than in typical prior art lithography techniques. For example, the photoresist may comprise a thickness of less than 600 nm, and more preferably comprises a thickness of 360 nm or less, for example.

Next, the ARC 244 is etched or opened, using the photoresist 246 as a mask. At this point, a majority of the photoresist 246 may remain over the ARC 244, e.g., at least half of the resist 246 is left remaining.

Figure 9A:
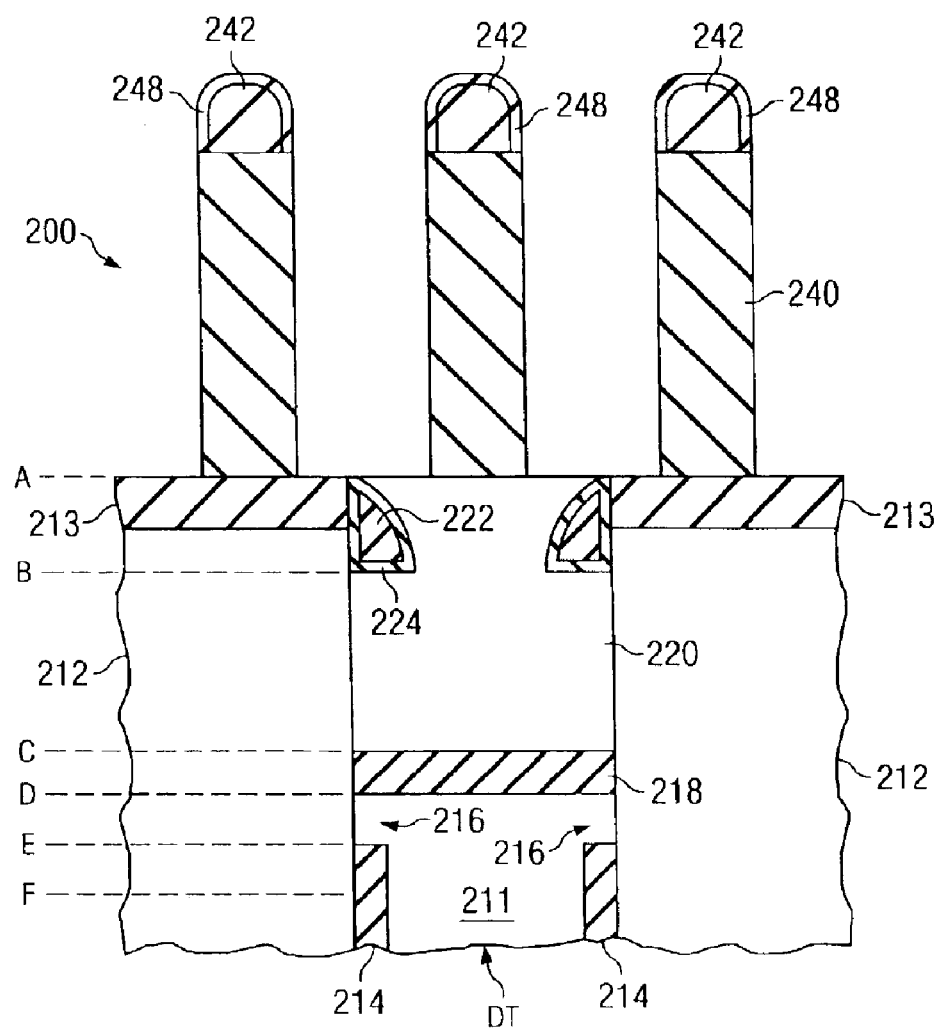
FIG. 9a shows the semiconductor wafer after the photoresist has been patterned, and the pattern from the photoresist has been transferred to the second and first hard masks.

Then, the pattern of the photoresist 246 is transferred to the second hard mask 242 and first hard mask 240, as shown in FIG. 9a. After the second hard mask 242 and first hard mask 240 are patterned, a small amount of the photoresist 246 may still remain after the first hard mask completion (not shown). Preferably, the remaining photoresist 246 is removed, to produce a better quality image and expose the top surface of the second hard mask 242.

The etch process for the second hard mask 242 may comprise different materials and properties than the etch process for the first hard mask 240, for example. The top surface of the second hard mask 242 may be curved at the edges or conical, as shown in FIG. 9a. Preferably, in accordance with an embodiment of the invention, the etchant for the first hard mask 240 alters the morphology of the exposed surface of second hard mask 242 to form altered region 248. For example, if the first hard mask 240 comprises BSG, and the second hard mask 242 comprises polysilicon, the BSG 240 etch may comprise a carbon-containing etchant, which forms a carbon-containing silicon region 248 on the top surface and sidewalls of the polysilicon 242, as shown in FIG. 9a. Thus, the second hard mask comprises polysilicon 242 and the carbon-containing silicon region 248. This is advantageous, because carbon-containing silicon region 248 is more resistant to etchant materials than polysilicon 242 during the first hard mask 240 etch process. Thus, the masking properties of the second hard mask 242/248 are improved, achieving an increased selectivity between the first hard mask 240 and second hard mask 242/248 materials.

Figure 9B:
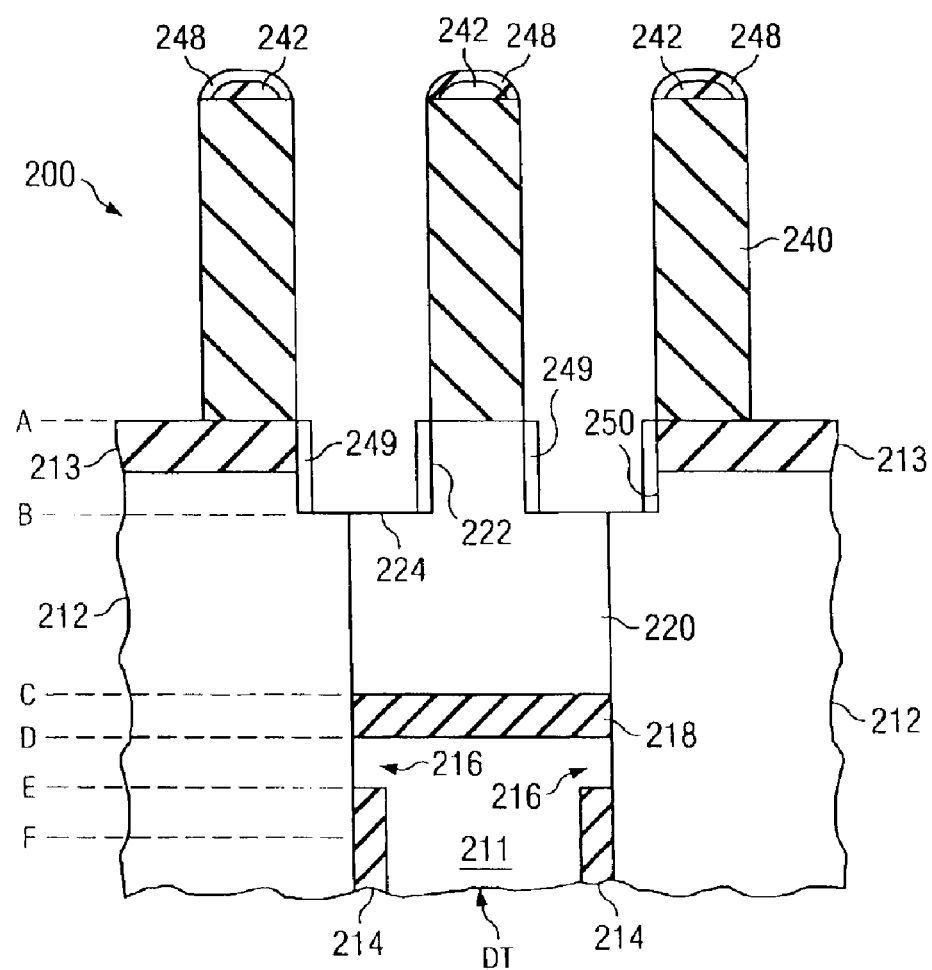
FIG. 9b shows a cross-sectional view of the wafer after the first etching zone A-B has been non-selectively etched, wherein a top portion of the second hard mask has been removed during the etch process.
Figure 9C:
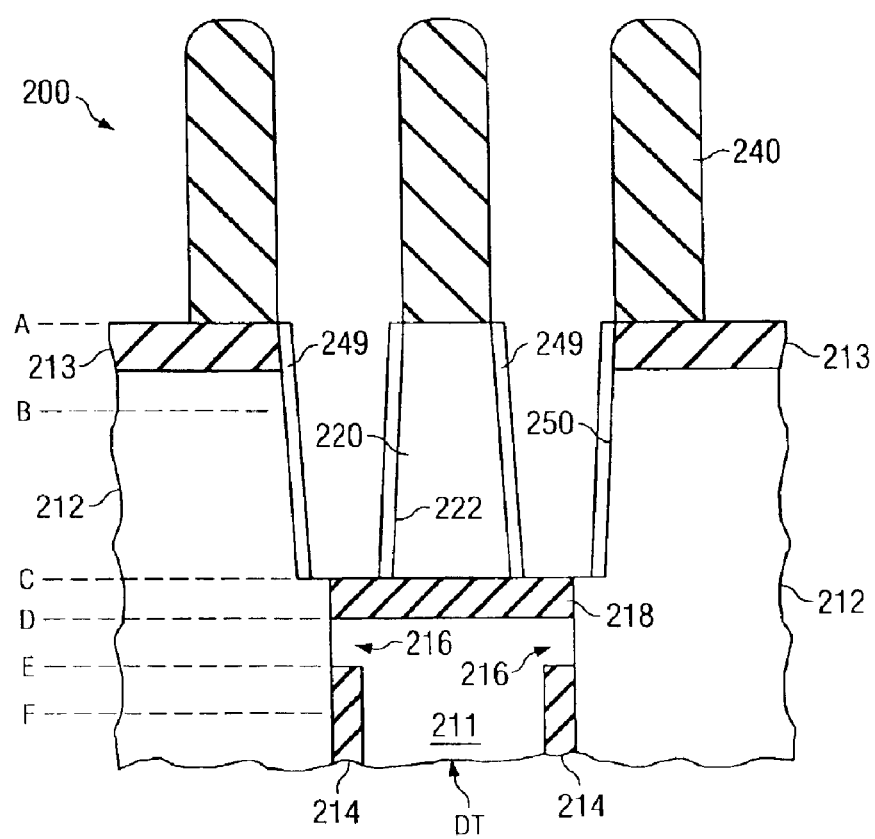
FIG. 9c shows a cross-sectional view of the wafer after the second etching zone B-C has been selectively etched, wherein the second hard mask is substantially unaffected by the etch process.
Figure 9E:
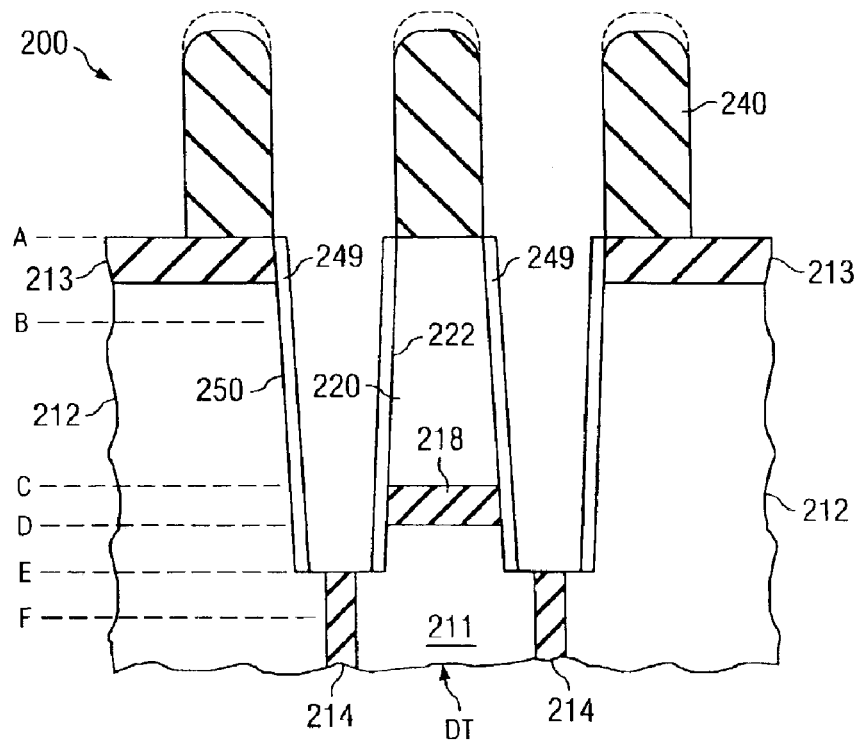
FIG. 9e shows a cross-sectional view of the wafer after the fourth etching zone D-E has been selectively etched in accordance with an embodiment of the invention, wherein a negligible amount of the second hard mask is removed during the etch process.
Figure 9F:
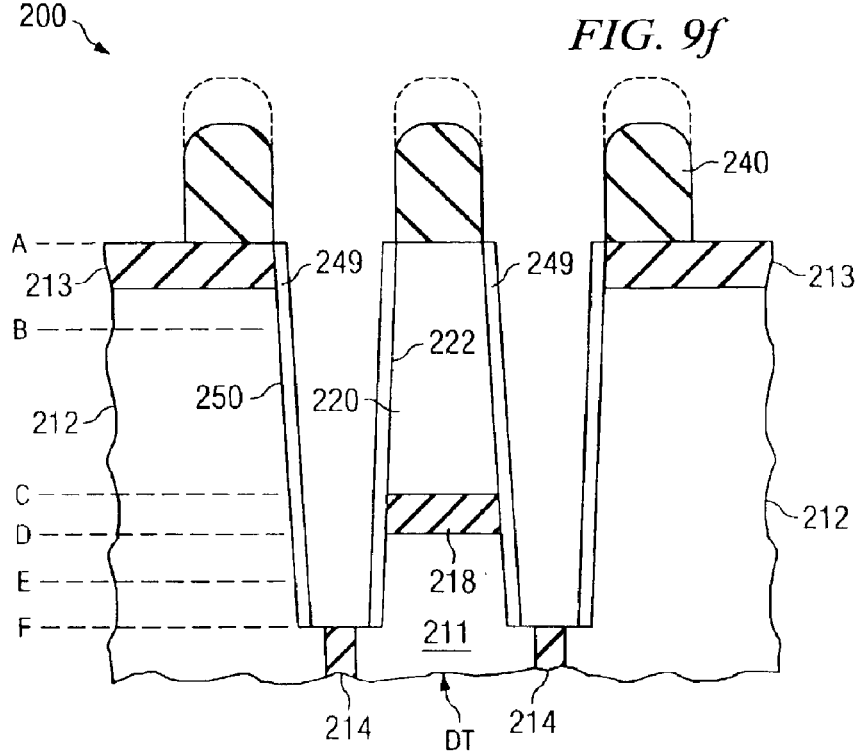
FIG. 9f shows a cross sectional view of the wafer shown in FIG. 9e, after the fifth etching zone E-F has been non-selectively etched, wherein the second hard mask and a portion of the first hard mask are removed during the etch process.
Figure 10:
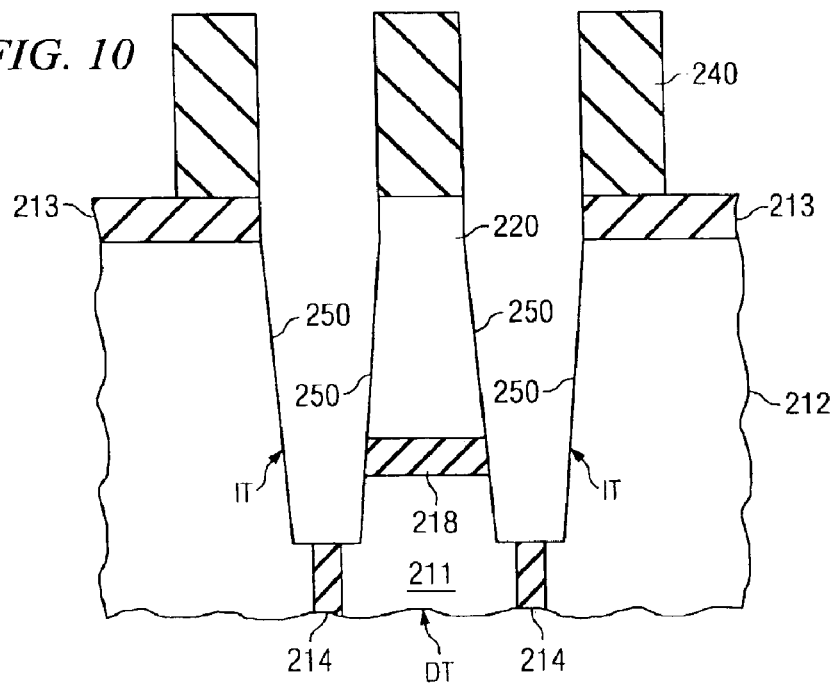
FIG. 10 illustrates a semiconductor device in accordance with a preferred embodiment of the present invention, wherein the resulting isolation trenches have sidewalls that slope slightly inward with increasing depth.
Figure 11:
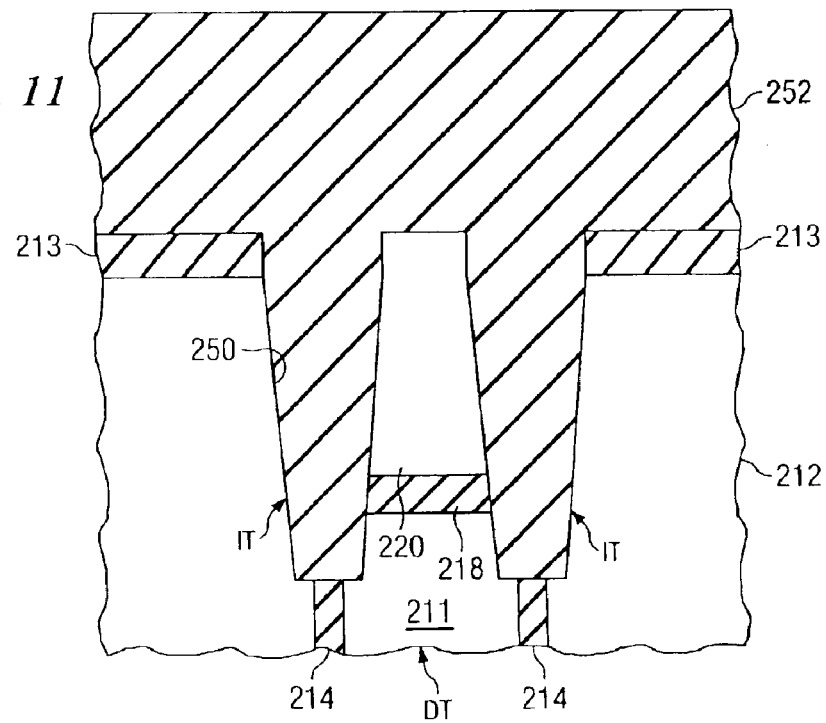
FIG. 11 shows the semiconductor device of FIG. 10, wherein the isolation trenches have been filled with an insulating material.

In accordance with an embodiment of the present invention, the wafer 200 is then patterned using two or more etch steps with the second hard mask 242 and/or first hard mask 240 to form isolation regions IT between device region DT and an adjacent device region DT (not shown) of the substrate 212, as shown in FIGS. 9b through 9f. Because of the novel etching processes to be described herein, advantageously, the isolation regions IT formed comprise sidewalls having smooth surfaces 250 that are slightly tapered inwardly towards the bottoms of the isolation trenches IT, as shown in FIG. 10. Because the smooth-surfaced sidewalls 250 are absent any re-etchant profiles, a complete fill of the trenches IT occurs when an insulating layer 252 is deposited over the wafer, as shown in FIG. 11.

The novel patterning process for the STI described herein is accomplished by using various etch recipes or processes resulting in etch profiles that are suitable for the various materials being etched, such as oxides 224, 218, 214, nitrides 213, 222, and various semiconductor materials 212, 211, 220 having different doping concentrations and morphologies (amorphous, crystalline or poly-crystalline), as examples. The substrate 200 is analyzed according to the various materials within a vertical direction, e.g., perpendicular to the wafer surface. The novel STI etch process of embodiments of the present invention comprise a combination of alternating relatively non-selective and relatively selective etch processes for the different etching zones. Etching zones having many different types of materials, e.g., oxides, nitrides, and semiconductor materials are preferably etched non-selectively, so that they are evenly etched. Etching zones having few different types of materials, e.g., different morphologies and doping concentrations of semiconductor materials, are etched relatively selectively, to preserve the first hard mask 240 and/or the second hard mask 242/248.

Shown in FIG. 9a, for example, for the STI patterning process, the substrate 212 is divided into various etching zones, such as first etching zone A-B between A and B, and second etching zone B-C between B and C disposed below the first etching zone A-B. The first etching zone A-B comprises at least one first material. The at least one first material preferably comprises an oxide, nitride, doped or undoped semiconductor material, or crystalline, amorphous or poly-crystalline semiconductor material, or combinations thereof, as examples. In the particular example shown, etching zone A-B includes a portion of pad nitride 213, nitride spacer 222 (encapsulated by silicon oxide 224), doped polysilicon 220, and crystalline silicon substrate 212, as examples. Preferably, a non-selective etch process is used to etch the first etching zone A-B, in accordance with an embodiment of the invention. The etch process for the first etching zone A-B is preferably non-selective because there are many different types of materials 213, 222, 220, 212 and 224 being etched simultaneously. The etch process may comprise a timed etch, and may alternatively may comprise an end-point etch, as examples.

Because a non-selective etch process is used for the first etching zone A-B, a portion of the second hard mask 242/248 is also removed during the etch process. For example, after the etch process for zone A-B, a portion of the second hard mask 242/248 is left remaining, as shown in FIG. 9b. Again, the top surface of the second hard mask 242/248 is curved or conical, as shown. If a RIE etch process is used, material is both removed and deposited in the etch process, with the removal being slightly greater than the deposition. Because of this phenomenon, the second hard mask 242 includes a carbon-containing region 248 formed on the top surface thereof.

A polymer layer 249 may be formed on the sidewalls 250 of the isolation trenches being formed, as a result of the etching process, also shown in FIG. 9b. The polymer layer 249 is very thin, and is continuously being simultaneously etched and deposited, again as a result of the RIE etch process. The polymer layer 249 may comprise traces of silicon, nitride and carbon, as examples. The polymer layer 249 is preferably removed before filling the isolation trenches with insulating material. The formation of the polymer layer 249 is advantageous because the polymer layer 249 provides passivation and prevents over-etching and undercutting of the pad nitride 213 sidewalls and substrate 212 sidewalls, as well as the polysilicon 220 sidewalls. Preferably, the polymer layer 249 is thin enough to not impact the critical dimension CD of the semiconductor device being etched.

The second etching zone B-C preferably comprises at least one second material, wherein the at least one first material of the first etching zone A-B may have a different etch selectivity than the at least one second material of the second etching zone B-C. The at least one second material may comprise an oxide, nitride, doped or undoped semiconductor material, or crystalline, amorphous or poly-crystalline semiconductor material, or combinations thereof, as examples. For example, in the example shown in FIG. 9a, the second etching zone B-C comprises a portion of the substrate 212 beneath the first etching zone A-B, and a portion of the doped polysilicon 220 disposed beneath the first etching zone A-B.

Referring again to FIG. 9b, next, preferably, a selective etch is used to etch the second etching zone B-C, in one embodiment of the invention. For example, an etch process having a relatively high degree of selectivity of polysilicon 211 and crystalline silicon 212 to the BSG in the first hard mask 240 is utilized, to preserve the material of the first hard mask 240 and to prevent the first hard mask 240 from being etched along with the isolation trench IT, leaving the structure shown in FIG. 9c. Because the etch process is selective, only a small amount of the first hard mask 240 is etched in the etch process for the second etching zone B-C, for example. Note that because the second hard mask 242/248 comprises polysilicon, the second hard mask 242/248 is removed during the etching of zone B-C.

Because the substrate 212 comprises crystalline silicon and the doped polysilicon 220 is doped, they will tend to etch at different rates. In accordance with embodiments of the invention, preferably, the etch process for the second etching zone B-C has a relatively low degree of selectivity between the region of doped polysilicon 220 and the region of single crystalline silicon 212, so that these two materials 212 and 220 are etched at substantially the same rate.

Referring again to FIG. 9c, once the trench top oxide 218 has been reached within the IT region, e.g., at etching zone C-D, the etch process is preferably changed back to a non-selective etch process. Again, the polymer layer 249 continues to be deposited and etched simultaneously along the sidewalls of the exposed surfaces within the isolation trenches being formed, as shown in FIG. 9c. The etch process for the second etching zone B-C may comprise a relatively low degree of selectivity between the region of doped polysilicon 220 and the region of single crystalline silicon 212, in one embodiment.

Depending on the device regions being isolated, a plurality of additional etching zones may be disposed below the second etching zone B-C. For example, in the embodiment shown in FIG. 9c, a third etching zone C-D is disposed beneath the second etching zone B-C. The third etching zone C-D comprises a portion of the substrate 212 beneath the second etching zone B-C, and a portion of the trench top oxide 218 disposed beneath the second etching zone B-C. In one embodiment, the etch process for the third etching zone C-D is preferably non-selective, preferably having a low but not extreme selectivity to oxide, leaving the structure shown in FIG. 9d. Because the etch process is non-selective, an additional amount of the first hard mask 240 is removed, e.g., an amount approximately equal to the thickness of etching zone C-D. At this stage, a large portion, e.g., over half, of the first hard mask 240 may remain, as shown.

Similarly, a fourth etching zone D-E may be disposed beneath the third etching zone C-D, comprising a portion of the substrate 212 beneath the third etching zone C-D, and a portion of the doped polysilicon 211 beneath the trench top oxide 218 of the third etching zone C-D. Because both materials 212 and 211 to be etched comprise silicon in various forms, preferably this etch is selective, in order to preserve the first hard mask 240, leaving the structure shown in FIG. 9e. A relatively small amount of the first hard mask 240 may be removed in this etch process, as shown, although because the etch is selective, a thickness of the first hard mask 240 smaller than the thickness of zone D-E is preferably removed, for example.

Likewise, a fifth etching zone E-F may be disposed beneath the fourth etching zone D-E, comprised of a portion of the substrate 212 beneath the fourth etching zone D-E, collar oxide 214, and doped polysilicon 211. The etch process for the fifth etching zone is preferably non-selective, in accordance with an embodiment of the present invention. The semiconductor wafer 200 after the fifth etching zone E-F etching procedure is shown in FIG. 9f. Because this etch step is non-selective, portions of the first hard mask 240 are removed during the etch process, e.g., the amount of the first hard mask 240 removed may be approximately equal to the thickness of the etching zone E-F removed.

Figure 9G:
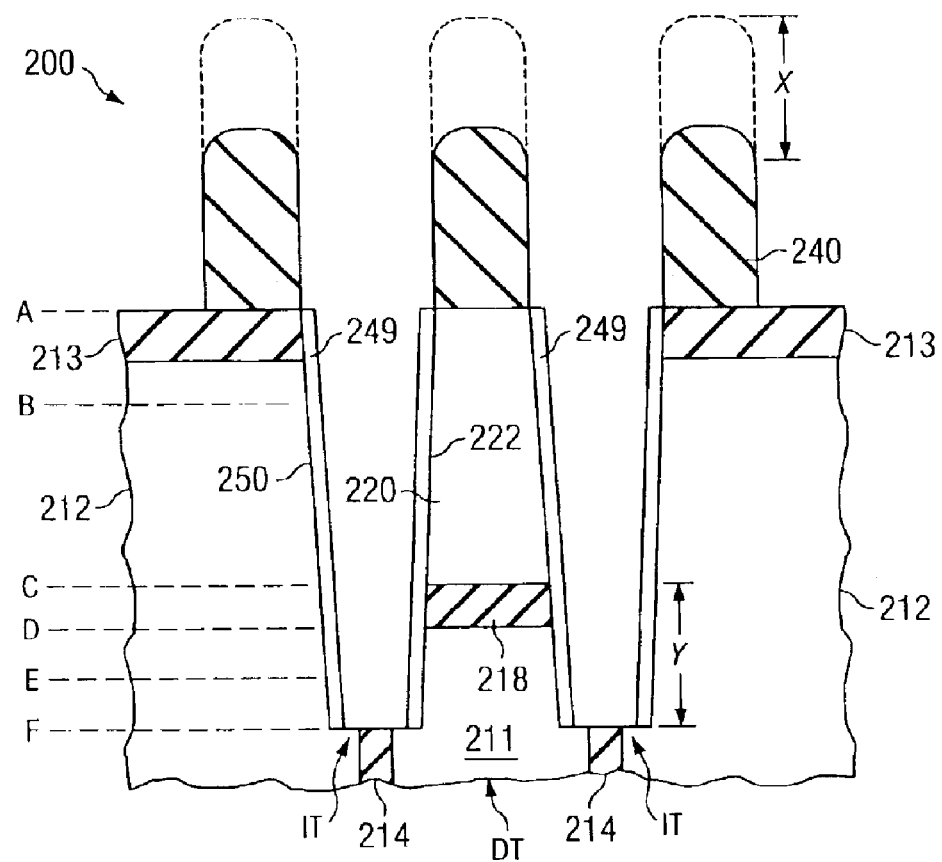
FIG. 9g shows a cross-sectional view of an embodiment of the present invention, wherein after the second etching zone is etched, as shown in FIG. 9c, the third, fourth and fifth etching zones C-D, D-E, and E-F are etched in a single non-selective etch process.

Embodiments of the invention involve adjusting the etch processes from one etching zone to the next, to avoid creating a re-entrant profile on the sidewall of the IT that is etched through the various material layers, and create smooth sidewalls of the isolation trenches, as shown in FIG. 10. In one embodiment of the invention, to achieve the smooth sidewalls, preferably, the different etching zones are alternatingly etched with selective and non-selective etch processes. For example, the first, third and fifth etching zones A-B, C-D, and E-F may be non-selectively etched, and the second and fourth etching zones B-C and D-E may be selectively etched, for example. In another embodiment of the present invention, the first etching zone A-B is non-selectively etched, and the second etching zone B-C is selectively etched, leaving the structure shown in FIG. 9c. The third, fourth and fifth etching zones C-D, D-E and E-F are then non-selectively etched in a single etch process, leaving the structure shown in FIG. 9g. Note that a larger amount of the first hard mask 240 is removed in this embodiment. In particular, the thickness y of the third, fourth and fifth etching zones C-D, D-E and E-F may be approximately equal to the thickness x of the first hard mask 240 removed, for example.

Preferably, the etch processes for the various etching zones A-B, B-C, C-D, D-E and E-F are different from one another; and in particular, etching processes for adjacent etching zones are different from one another. For example, patterning the first etching zone A-B of the substrate may comprise a first etch process, and patterning the second etching zone B-C may comprise a second etch process, wherein the first etch process is different from the second etch process.

Also, in accordance with an embodiment of the invention, at least one etching zone comprises a region of doped polysilicon and a region of single crystalline silicon, such as the second etching zones B-C and fourth etching zones D-E. In these zones, preferably, patterning the substrate comprises a low selectivity between the region of doped polysilicon 220 and 211, and the region of single crystalline silicon 212, so that the different forms of silicon 220, 211 and 212 are etched at substantially the same rate.

In preferred embodiments of the present invention, a polymer 249 is formed over the sidewalls of the isolation trenches IT being etched, which advantageously protects the sidewalls of the various materials 213, 212, 218, 220 being etched, assisting in the prevention of undercut and re-entry profile formation. The polymer 249 provides passivation for the sidewalls of the substrate and material layers being etched. The patterning of the wafer 200 described herein may comprise plasma etch processes, for examples. The polymer 249 thickness is controlled by balancing ion/radical ratios of the plasma etch process, to provide a sufficient amount of passivation for the sidewalls. Balancing of the ion/radical ratios is achieved by selection of the etchant gas, amount of pressure and amount of power used for the plasma etch processes. The balancing of the ion/radical ratios may depend on the types of reactors and chemistries used, for example. The sidewall passivation 249 provides profile control and lateral etch prevention.

The etch processes for the various etching zones A-B, B-C, C-D, D-E and E-F may be varied by changing the etchant chemistries, gases and/or materials, processing times, pressures, or other parameters. As described above, by carefully selecting the ion/radical ratio, lateral etch for doped and intrinsic semiconductor material layers may be avoided. In addition, patterning the substrate preferably comprises using a less reactive and less easily dissassociated etchant, and alternatively, the etch process may comprise using an etchant having less electronegative than prior art etchant processes, for example. Therefore, preferably, etch chemistries such as fluorocarbon gases are used, which are less reactive and less easily dissassociated compared to chlorine-type (e.g., $Cl_2$) or fluorine-type ($NF_3$) chemistries. The polymer 249 that is formed during the etch processes described herein protects the sidewalls 250, particularly in combination with the careful selection of ion/radical ratios, assist in preventing the lateral etch of the various material layers. The polymer 249 is preferably removed in a cleaning step prior to filling the isolation trenches IT with an insulator 252, as shown in FIGS. 10 and 11. The first hard mask 240 may be removed before filling the isolation trenches IT, as shown in FIG. 11.

Advantageously, by choosing etch processes and varying the etch selectivity according to the materials being etched in each etching zone, the various masking layers, such as first hard mask 240 and second hard mask 242/248 are not excessively etched while etching the etching zones A-B, B-C, C-D, D-E and E-F. Preferably, an amount of second hard mask material 242 and first hard mask material 240 is deposited over the substrate 212 prior to the etching procedure so that a moderate amount, e.g., 20 nm or more, of the first hard mask material 240 is left remaining over the wafer 200 after the final (fifth, zone E-F) etching process.

In the embodiments shown in FIG. 9a through 9f, the second hard mask 240 is removed during the etching of zone B-C. Alternatively, an amount of second hard mask material 242 may be deposited, and etch chemistries and parameters may be selected, the so that a small amount second hard mask material 242 and the entire thickness of the first hard mask material 240 remain after the etching of zone E-F, for example. Preferably, after the etch processes described herein to form the isolation trenches IT within all five zones A-B, B-C, C-D, D-E, and E-F, enough of at least the first hard mask material 240 remains to preserve the integrity of the pad nitride 213.

Preferably, the etch process steps and conditions are carefully selected and tuned, to etch the various materials layers, such as oxides 224, 218, 214, nitrides 213, 222, and various semiconductor materials 212, 211, 220 having different doping concentrations, within the constraints of the pattern profile and the mask 240/242/246 materials. The second hard mask 242 may require a separate etch step from the first hard mask 240 etch step.

An example of a process flow for an embodiment of the invention, shown in FIGS. 9a through 9f, is shown in Table 1:

For example, in Step 1, etching zone A-B is etched, in Step 2, etching zone B-C is etched, in Step 3, etching zone C-D is etched, in Step 4, etching zone D-E is etched, and in Step 5 etching zone is etched. In Table 2, E/R=etch rate, and sccm=standard cubic centimeter per minute, as examples. A step-wise process for STI is shown in Table 2 and is

TABLE 1

| STEP PURPOSE | Temp | Recipe Details |
|---|---|---|
| Open 82 nm ARC (244 in FIG. 8)/ 120 nm Poly (242) etch and PR (246) strip | Wall/ESC 60/60 | ARC OPEN: 6mT/440Wt/70Wb/30HBr/10O$_2$/42s<br>POLY ETCH: 20mT/350Wt/50Wb/100HBr/50Cl$_2$/310He/71.5s<br>RES. STRIP: 20mT/1000Wb/200O$_2$/40He/75s |
| Etch 530 nm BSG (240) | T/W/C 60/60/60 | BT: 46mT/1400W/50CO/200Ar/10C$_4$F$_8$/5O$_2$ C/E 40/7 10s<br>ME: 58mT/1700W/300CO/380Ar/16C$_4$F$_8$ C/E 40/7 120s<br>IGN: 30mT/300W/20O$_2$/100N2 C/E 40/7 3s<br>PET: 30mT/200W/20O$_2$/100N2 C/E 40/7 30s |
| Etch IT: pad nitride (213 in FIG. 9a), DT spacer (222 and 224), poly (220), TTO (218), poly (211) and collar (214) | Cham/ESC/ Chiller 60/50/50 | S1: 5mT/243Wt/180Wb/35NF$_3$/1000He/80s<br>M1: 4mT/437Wt/180Wb/50HBr/10NF$_3$/30He/20HCl/54s<br>S2: 5mT/243Wt/180Wb/35NF$_3$/100He/45s<br>M2: 4mT/437Wt/180Wb/50HBr/10NF$_3$/30He/20HCl/28s<br>S3: 5mT/243Wt/180Wb/35NF$_3$/100He/15s |

Note that in Table 1, ESC=Electrostatic Chuck, T/W/C=top/walls/cathode, Wt=top power, Wb=bottom power, W=power, C/E=center and edge cooling in Torr, IGN=Ignition, PET=post etch clean, S1=A-B etching zone, M1=B-C etching zone, S2=C-D etching zone, M2=D-E etching zone, and S3=E-F etching zone.

In another embodiment, the process can be tailored as shown in Table 2, where zones A-B through E-F can be etched using fluorocarbon gases, as an example.

TABLE 2

| Parameter | Step 1 Value | Step 2 Value | Step 3 Value | Step 4 Value | Step 5 Value |
|---|---|---|---|---|---|
| Pressure (mT) | 50 | 4 | 5 | 4 | 5 |
| Top Power (W) | 400 | 437 | 243 | 437 | 243 |
| Bottom Power (W) | 270 | 180 | 180 | 180 | 180 |
| CHF$_3$ (sccm) | 50 | 0 | 0 | 0 | 0 |
| CF$_4$ (sccm) | 0 | 0 | 0 | 0 | 0 |
| NF$_3$ (sccm) | 0 | 10 | 35 | 10 | 35 |
| HBr (sccm) | 0 | 50 | 0 | 50 | 0 |
| HCl (sccm) | 0 | 20 | 0 | 20 | 0 |
| O$_2$ (sccm) | 10 | 0 | 0 | 0 | 0 |
| He—O (sccm) | 0 | 0 | 0 | 0 | 0 |
| He (sccm) | 100 | 30 | 100 | 30 | 100 |
| Time (sec) | 68 | 54 | 45 | 28 | 15 |
| Si E/R (nm/min) | 66.4 | 236.6 | 162.6 | 236.6 | 162.6 |
| Ox E/R (nm/min) | 159.6 | 64.4 | 92.8 | 64.4 | 92.8 |
| Nit E/R (nm/min) | 194.7 | n/a | 150.6 | n/a | 150.6 | described along with some representative etch rates of various films. A stabilization step may be performed between each step, for example. The etch processes for the first and second masks 240 and 242/248 are not shown in Table 2.

Another example of a process flow for an embodiment of the invention, as shown in FIGS. 9a through 9f, including using a dual hard mask etch for profile improvement is shown in Table 3. The process described in Table 3 can be operated within certain ranges of parameters for adapting to film thickness and depth variations, for example.

TABLE 3

| Etch step | Pressure | Power-top | Power-bottom | Etchant | Time/other |
|---|---|---|---|---|---|
| ARC 244 etch | 3–10 mT | 100–300 W | 50–170 W | 50–150CF$_4$ | Endpoint with overetch |
| Second hard mask | 5–50 | 100– | 10–100 | 10–70 Cl$_2$/50–150HBr | Endpoint |

TABLE 3-continued

| Etch step | Pressure | Power-top | Power-bottom | Etchant | Time/other |
|---|---|---|---|---|---|
| (poly-Si) 242 etch | mT | 500 W | W | | with over-etch |
| First hard mask (BSG) 240 etch | 40–90 mT | 1200–2000 W | | 100–300CO/200p14 500Ar/10–20$C_4F_8$ or $C_5F_6$/1–10$O_2$ | Endpoint with over-etch |
| First etching zone A–B | 20–70mT | 300–500 W | 200–340 W | 20–70$CHF_3$/5–15 $O_2$/50–150He | 50–90" |
| Second etching zone B–C | 5–25 mT | 175–300 W | 80–200 W | 5–25$NF_3$/100–300HBr/10–20He—$O_2$/50–150He | 40–100" |
| Third etching zone C–D | 20–80 mT | 300–500 W | 200–340 W | 20–80$CHF_3$/5–15$O_2$/50–150He | 10–30" |
| Fourth etching zone D–E | 4–25 mT | 200–300 W | 50–300 W | 10–50$CF_4$/2–10$_2$/5–20$NF_3$ 10–50$CHF_3$/50–100He | 10–60" |
| Fifth etching zone E–F | 4–10 mT | 200–300 W | 400–500 W | 5–20$NF_3$/10–60$CHF_3$/50–200 He | 10–60" |

In another embodiment, the etching of zones C-D through E-F may be further simplified by a relatively low selectivity process to prevent any residual polysilicon or crystalline silicon. Such a process is outlined in Table 4, wherein etching zone A-B is etched in Step 1, etching zone B-C is etched in Step 2, and etching zones C-D, D-E and E-F are etched in Step 3.

Table 4 includes the approximate etch rates for the different films being etched. Again, a stabilization step may be performed between each step, for example.

TABLE 4

| Parameter | Step 1 Value | Step 2 Value | Step 3 Value |
|---|---|---|---|
| Pressure (mT) | 50 | 4 | 10 |
| Top Power (W) | 400 | 437 | 245 |
| Bottom Power (W) | 270 | 180 | 200 |
| $CHF_3$ (sccm) | 50 | 0 | 20 |
| $CF_4$ (sccm) | 0 | 0 | 30 |
| $NF_3$ (sccm) | 0 | 10 | 20 |
| HBr (sccm) | 0 | 50 | 0 |
| HCl (sccm) | 0 | 20 | 0 |
| $O_2$ (sccm) | 10 | 0 | 5 |
| He—O (sccm) | 0 | 0 | 0 |
| He (sccm) | 100 | 30 | 40 |
| Time (sec) | 68 | 54 | 60 |
| Si E/R (nm/min) | 66.4 | 236.6 | ~193.3 |
| Ox E/R (nm/min) | 159.6 | 64.4 | ~131.3 |
| Nit E/R (nm/min) | 194.7 | n/a | ~221.6 |

The etch processes for the first and second masks 240 and 242/248 are not shown in Table 4.

Note that in some of the etch processes listed in the tables, $NF_3$ may be added to the etchant material, which is a low polymerizing gas, which prevents the IT from becoming too narrow due to too much polymer forming on the sidewalls during the etch process. To improve or reduce the amount of bow in the bottom of the IT, the pressure may be reduced, while increasing the sop or source power, while keeping the profile vertical.

Note also that in Tables 1, 2 and 4, the process parameters and etch rates are exemplary and may range +/−10 to 50% of the values listed. The etch processes described herein may be end-pointed rather than timed, for example. Furthermore, the selective etch processes described herein are preferably more selective than the non-selective etch processes described herein. For example, the selective etches may merely be selective relative to the non-selective etch processes.

Figure 12:
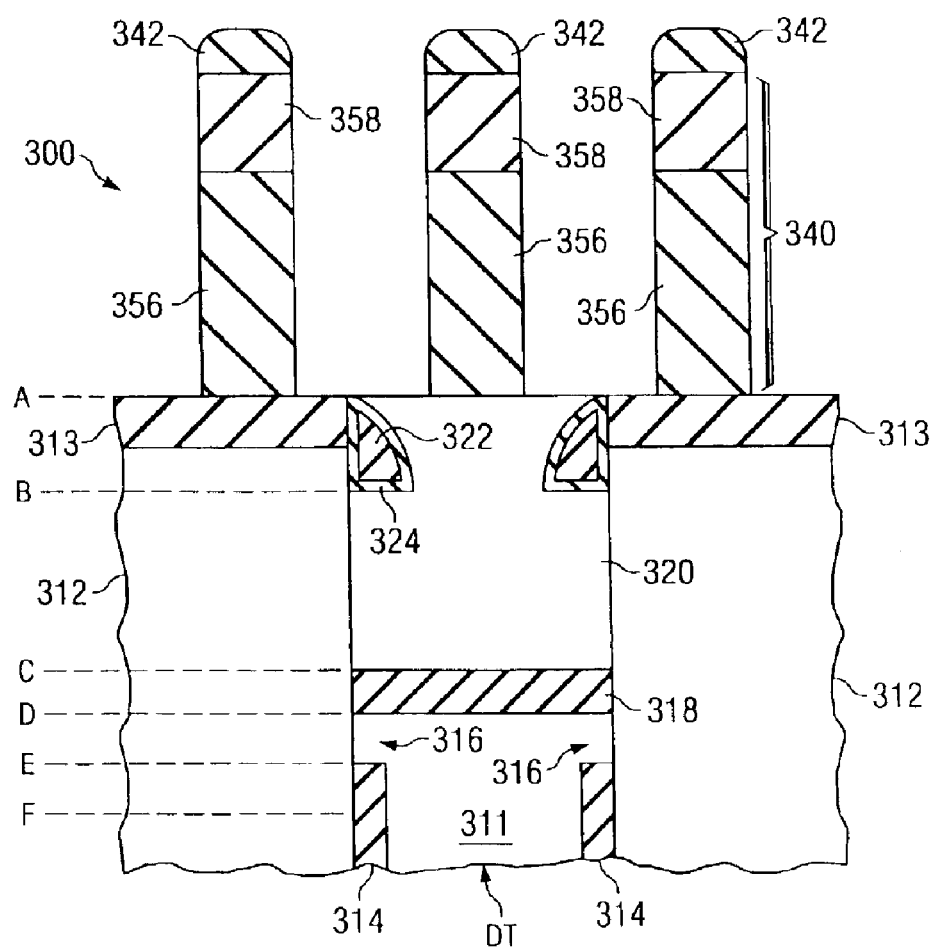
FIG. 12 illustrates another embodiment of the present invention, wherein the first hard mask comprises a dual mask.

In one embodiment of the present invention, the first hard mask 340 comprises two layers 356 and 358. For example, as shown in FIG. 12, the first hard mask 340 bottom layer 356 preferably comprises a doped insulator, and the first hard mask 340 top layer 358 preferably comprises an undoped insulator. The bottom layer 356 may comprise 500 nm of BSG or BPSG, as examples, and the top layer 358 may comprise 110 nm of undoped silicate glass (USG), as examples. The bottom layer 356 may range from 100–600 nm and the top layer 358 may range from 50 to 200 run, for example. The top layer 358 protects the bottom layer 356 during the etching of doped or undoped polysilicon layers within the wafer 300, and prevents the depletion of dopants such as boron from the BSG 356, for example. Thus, the top layer 358 helps preserve the underlying bottom layer 356 during the etch process. The boron or dopant in the BSG or doped insulator bottom layer 356 provides etch selectivity in the various selective etch processes.

Embodiments of the present invention also include semiconductor devices patterned according to the methods described herein. As examples, the invention includes memory devices, such as vertical DRAM devices, patterned according to the methods described herein.

Advantages of preferred embodiments of the present invention include providing a novel integration scheme for patterning a semiconductor wafer 200/300 that produces smooth sidewalls 250, optimized for a subsequent fill process, in spite of the variety of materials being etched in a particular zone. The etch process generates the smooth sidewalls 250 exhibiting no bowing, and no re-entry profiles, without material dependent biases. The same smooth substantially vertical slope 250 is formed on both polycrystalline 211 sidewall surfaces and doped polysilicon 220 sidewall surfaces. The use of a thinner layer of photoresist 246 may be accomplished, by using a dual hard mask 240/242, 340/342. Because a thin layer of photoresist 246 is used, the image resolution is improved, and there is no concern about photoresist 246 integrity due to photoresist high aspect ratios. Because re-etchant profiles are not generated using the novel patterning method, void-free insulating layers 252 can be formed within the isolation trenches IT patterned. The characteristics of the top and side region 248 of the second hard mask 242 may be altered by the addition of carbon in the etch process for the first hard mask, making the second hard mask more etch resistant. A polymer 249 formed over the sidewalls of the isolation trenches assists in preventing undercutting and re-entry profile formation.

Figure 3:
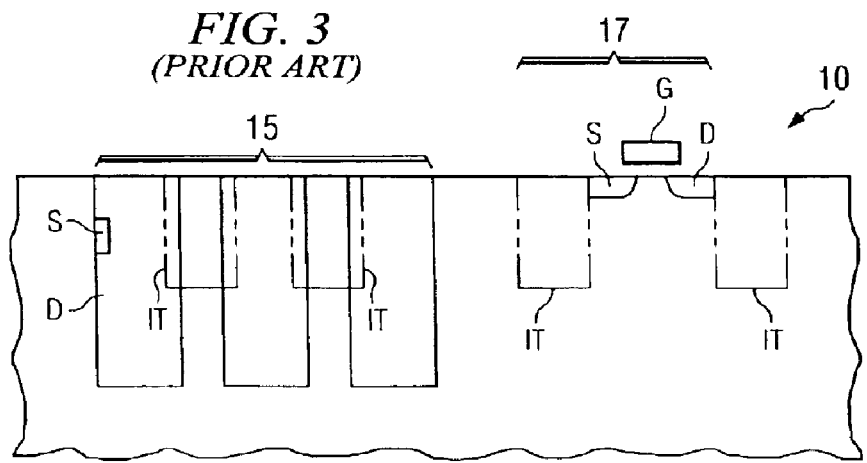
FIG. 3 illustrates a cross-sectional view of a prior art vertical/planar cell having vertical regions and planar regions.

Embodiments of the present invention are particularly advantageous in small ground rules, such as ground rules of 110 nm or less, utilizing 193 nm lithography, as examples. The patterning methods described herein may be used for memory devices having vertical transistors and/or planar transistors, as examples. Embodiments of the present invention are particularly advantageous in semiconductor devices 10 having both vertical regions 15 and planar regions 17, as shown in FIG. 3, as an example.

Although the present invention and its advantages have been described in detail, it should be understood that various changes, substitutions and alterations can be made herein without departing from the spirit and scope of the invention as defined by the appended claims. For example, it will be readily understood by those skilled in the art that the semiconductor devices patterned, and materials, processes, pressures and gases described herein may be varied while remaining within the scope of the present invention. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of patterning a semiconductor device, comprising:
providing a substrate, the substrate comprising a plurality of device regions having a first etching zone comprised of at least one first material, and at least one second etching zone disposed below said first etching zone comprised of at least one second material, said at least one first material having a different etch selectivity than said at least one second material;
depositing a first hard mask over the substrate, the first hard mask comprising a first selected material;
depositing a second hard mask over the first hard mask, the second hard mask comprising a second selected material, the second selected material being different from the first selected material;
depositing a photoresist over the second hard mask;
patterning the photoresist;
transferring the pattern of the photoresist to the second hard mask;
transferring the pattern of the photoresist to the first hard mask; and
patterning the substrate with at least the second hard mask and first hard mask to form isolation regions between the device regions of the substrate.

2. The method according to claim 1, further comprising depositing an anti-reflective coating over the second hard mask.

3. The method according to claim 1, wherein depositing the photoresist comprises depositing 360 nm or less of photoresist.

4. The method according to claim 1, further comprising removing the photoresist, before patterning the substrate.

5. The method according to claim 1, wherein depositing the first hard mask comprises depositing an oxide material, and wherein depositing the second bard mask comprises depositing a semiconductor material.

6. The method according to claim 5, wherein depositing the oxide material comprises depositing boron-doped silicon glass (BSG), borophosphosilicate glass (BPSG) or tetraethoxysilate (TEOS), and wherein depositing the semiconductor material comprises depositing polysilicon.

7. The method according to claim 6, wherein transferring the pattern of the photoresist to the first hard mask comprises altering exposed surfaces of the second mask.

8. The method according to claim 7, wherein transferring the pattern of the photoresist to the first bard mask comprises using a carbon-containing etchant, wherein altering the exposed surfaces of the second mask comprises forming a carbon-containing silicon region on exposed surfaces of the second hard mask.

9. The method according to claim 5, wherein depositing the oxide material comprises depositing 50 to 600 nm of the oxide material, and wherein depositing the semiconductor material comprises depositing 50 to 200 nm of the semiconductor material.

10. The method according to claim 5, wherein depositing the first hard mask comprises depositing a first oxide material and depositing a second oxide material over the first oxide material.

11. The method according to claim 10, wherein depositing the first oxide material comprises depositing boron-doped silicon glass (BSG) and wherein depositing the second oxide material comprises depositing undoped silicon glass (USG).

12. The method according to claim 1, wherein the at least one first material comprises an oxide material, a nitride material, a doped semiconductor material, an undoped semiconductor material, a crystalline semiconductor material, an amorphous semiconductor material or a poly-crystalline semiconductor material; and wherein the at least one second material comprises an oxide material, a nitride material, a doped semiconductor material, an undoped semiconductor material, a crystalline semiconductor material, an amorphous semiconductor material or a poly-crystalline semiconductor material.

13. The method according to claim 1, wherein patterning the first etching zone of the substrate comprises a first etch process, wherein patterning the at least one second etching zone comprises a second etch process, wherein the first etch process is different from the second etch process.

14. The method according to claim 1, wherein patterning the substrate comprises patterning the first etching zone using a non-selective etch process, and patterning the at least one second etching zone using a selective etch process.

15. The method according to claim 1, wherein at least one of the first etching zone or second etching zone comprises a region of doped polysilicon and a region of single crystalline silicon, wherein a patterning the etching zone comprising a region of doped polysilicon and a region of single crystalline silicon comprises an etch process having a relatively high degree of selectivity to the doped polysilicon and crystalline silicon to the first hard mask material.

16. The method according to claim 15, wherein the etch process comprises a relatively low degree of selectivity between the region of doped polysilicon and the region of single crystalline silicon.

17. The method according to claim 1, wherein patterning the substrate comprises a plasma etch process, further comprising balancing ion/radical ratios of the plasma etch process to provide a sufficient amount of passivation for the sidewalls of the substrate and material layers being etched, wherein the sidewall passivation provides profile control and lateral etch prevention.

18. The method according to claim 17, wherein providing the sidewall passivation comprises forming a polymer over the exposed portions of the sidewalls of the substrate and the material layers being patterned.

19. The method according to claim 17, wherein balancing the ion/radical ratios comprises selecting an etchant gas, amount of pressure and power for the plasma etch process.

20. The method according to claim 1, wherein providing the substrate further comprises a third etching zone disposed below the second etching zone; and wherein patterning the substrate comprises patterning the first etching zone using a non-selective etch process, patterning the second etch zone using a selective etch process, and patterning the third etching zone using a non-selective etch process.

21. The method according to claim 20, wherein providing the substrate comprises providing a substrate having at least one fourth etching zone disposed below the third etching zone, and at least one fifth etching zone disposed below each at least one fourth etching zone; and wherein patterning the substrate comprises patterning each fourth etching zone using a selective etch process, and patterning each fifth etching zone using a non-selective etch process.

22. The method according to claim 20, wherein providing the substrate comprises providing a substrate having at least one fourth etching zone disposed below the third etching zone, and at least one fifth etching zone disposed below each at least one fourth etching zone; and wherein patterning the substrate comprises patterning the at least one fourth etching zone and at least one fifth etching zone with the same non-selective etch process used to pattern the third etching zone.

23. The method according to claim 20, wherein the non-selective etch processes comprise a fluorocarbon chemistry.

24. The method according to claim 1, wherein patterning the substrate comprises using a less reactive and/or less disassociation etchant than chlorine-type or fluorine-type chemistries.

25. A semiconductor device patterned according to the method of claim 1.

26. A method of patterning isolation trenches of a memory device, comprising:
providing a semiconductor wafer having a top surface and including a substrate having a plurality of memory cells formed therein, the semiconductor wafer including a first etching zone and a second etching zone disposed beneath the first etching zone;
depositing a first bard mask over the substrate, the first hard mask comprising an oxide;
depositing a second hard mask over the first hard mask, the second hard mask comprising a semiconductor material;
depositing a photoresist over the second bard mask;
patterning the photoresist with an isolation trench pattern;
transferring the isolation trench pattern to the second hard mask and the first hard mask; and
patterning the semiconductor wafer with the second hard mask and the first bard mask to form isolation trenches in the substrate between the memory cells, wherein the etch process for the second etching zone is different from the etch process for at least the first etching zone.

27. The method according to claim 26, wherein patterning the semiconductor wafer comprises altering the etchant process for the first etching zone, and altering at least the second etching zone to generate a smooth sidewall etch in the substrate in a direction substantially perpendicular to the top surface of the wafer.

28. The method according to claim 27, further comprising filling the isolation trenches with an insulating material.

29. A memory device patterned in accordance with the method of claim 28.

30. The memory device according to claim 29, wherein the memory cells comprise vertical dynamic random access memory (DRAM) cells.

31. The memory device according to claim 30, wherein the semiconductor wafer comprises at least one vertical region and at least one planar region, wherein the vertical regions comprise the vertical DRAM cells, wherein patterning the semiconductor wafer comprises forming isolation trenches in the at least one vertical region and the at least one planar region of the semiconductor wafer.

32. The method according to claim 26, wherein providing a semiconductor wafer comprises providing a substrate comprising a crystalline silicon material covered with a pad nitride, the substrate having at least one deep trench formed therein, a collar oxide formed within a bottom portion of the at least one deep trench, the bottom portion of the at least one deep trench being filled with a first doped polysilicon material, a trench top oxide being formed over the first doped polysilicon material, a second doped polysilicon material being formed over the trench top oxide in a top portion of the at least one deep trench, a nitride spacer being formed over a portion of the second doped polysilicon at an edge region of the top portion of the at least one deep trench, the nitride spacer being encapsulated in an oxide layer at a bottom portion, side portion and top portion, the top portion being curved inwardly towards a center of the at least one deep trench, wherein a portion of the pad nitride, crystalline silicon material, nitride spacer, spacer oxide layer; and second doped polysilicon material define a first etching zone, wherein a portion of the czystalline silicon material disposed beneath the first etching zone crystalline silicon material and a portion of the second doped polysilicon material disposed beneath the nitride spacer comprise a second etching zone, wherein a portion of the crystalline silicon material disposed beneath the second etching zone crystalline silicon material and a portion of the trench top oxide comprise a third etching zone, wherein a portion of the crystalline silicon material disposed beneath the third etching zone crystalline silicon material and a portion of the first doped polysilicon material comprise a fourth etching zone, and wherein a portion of the crystalline silicon material disposed beneath the fourth etching zone crystalline silicon material, a portion of the first doped polysilicon material disposed beneath the fourth etching zone, and a portion of the collar oxide comprise a fifth etching zone.

33. The method according to claim 32, wherein etching the first etching zone comprises a non-selective etch process, wherein etching the second etching zone comprises a selective etch process, and wherein etching at least the third etching zone comprises a non-selective etch process.

34. The method according to claim 33, wherein etching at least the third etching zone further comprises etching the fourth etching zone.

35. The method according to claim 34, wherein etching at least the third etching zone further comprises etching the fifth etching zone.

36. The method according to claim 33, further comprising etching the fourth etching zone and etching the fifth etching zone, wherein etching the fourth etching zone comprises a selective etch process, and wherein etching the fifth etching zone comprises a non-selective etch process.

37. The method according to claim 33, wherein the non-selective etch processes comprise a fluorocarbon chemistry.

38. The method according to claim 33, wherein depositing the first hard mask comprises depositing boron-doped silicon glass (BSG), borophosphosilicate glass (BPSG) or tetraethoxysilate (TEOS), and wherein depositing the second hard mask comprises depositing polysilicon.

39. The method according to claim 38, wherein transferring the pattern of the photoresist to the first hard mask comprises altering exposed surfaces of the second mask.

40. The method according to claim 39, wherein transferring the pattern of the photoresist to the first hard mask comprises using a carbon-containing etchant, wherein altering the exposed surfaces of the second mask comprises forming a carbon-containing silicon region on exposed surfaces of the second hard mask.

41. The method according to claim 26, wherein depositing the first hard mask comprises depositing 50 to 600 nm of the oxide material, and wherein depositing the semiconductor material comprises depositing 50 to 200 nm of the semiconductor material.

42. The method according to claim 41, wherein depositing the first oxide material comprises depositing boron-doped silicon glass (BSG) and wherein depositing the second oxide material comprises depositing undoped silicon glass (USG).

43. The method according to claim 26, wherein depositing the first bard mask comprises depositing a first oxide material and depositing a second oxide material over the first oxide material.

44. The method according to claim 26, wherein depositing the photoresist comprises depositing 360 nm or less of photoresist.

45. The method according to claim 26, wherein patterning the substrate comprises using a less reactive and/or less disassociative etchant than chlorine-type or fluorine-type chemistries.

46. The method according to claim 26, wherein patterning the substrate comprises a plasma etch process, further comprising balancing ion/radical ratios of the plasma etch process to provide a sufficient amount of passivation for the sidewalls of the substrate and material layers being etched, wherein the sidewall passivation provides profile control and lateral etch prevention.

47. The method according to claim 46, wherein providing the sidewall passivation comprises forming a polymer over the exposed portions of the sidewalls of the substrate and the material layers being patterned.

48. The method according to claim 46, wherein balancing the ion/radical ratios comprises selecting an etchant gas, amount of pressure and power for the plasma etch process.

* * * * *

UNITED STATES PATENT AND TRADEMARK OFFICE
CERTIFICATE OF CORRECTION

PATENT NO. : 6,893,938 B2
DATED : May 17, 2005
INVENTOR(S) : Naeem et al.

It is certified that error appears in the above-identified patent and that said Letters Patent is hereby corrected as shown below:

Column 19,
Lines 53 and 58, delete "bard" and insert -- hard --.

Signed and Sealed this

Sixteenth Day of August, 2005

JON W. DUDAS
*Director of the United States Patent and Trademark Office*